United States Patent [19]

Shumway

[11] Patent Number: 5,016,205
[45] Date of Patent: May 14, 1991

[54] DIGITAL SIGNAL PROCESSOR BASED AGC

[75] Inventor: Peggy P. Shumway, Schaumburg, Ill.

[73] Assignee: Motorola, Inc., Schaumburg, Ill.

[21] Appl. No.: 344,321

[22] Filed: Apr. 27, 1989

[51] Int. Cl.⁵ .............................................. H03G 3/20
[52] U.S. Cl. .................... 364/715.01; 375/98
[58] Field of Search ............... 364/715.01; 375/98; 330/129, 280

[56] References Cited

U.S. PATENT DOCUMENTS

| | | | |
|---|---|---|---|
| 4,623,934 | 11/1986 | Taylor | 375/98 |
| 4,747,065 | 5/1988 | West | 364/715.01 |
| 4,785,418 | 11/1988 | Pearce et al. | 364/715.01 |
| 4,859,964 | 8/1989 | Jorgensen | 330/129 |
| 4,901,333 | 2/1990 | Hodgkiss | 375/98 |

Primary Examiner—David H. Malzahn
Attorney, Agent, or Firm—Wayne J. Egan

[57] ABSTRACT

A digital signal processor based automatic gain control (AGC) is disclosed for adjusting the gain of a signal processor. According to the invention, an input signal is provided and at least one value is determined based on the energy of the signal. Thereafter, the desired signal gain is computed responsive to the energy value or values. One advantage of this AGC is that it may easily be implemented in digital format by means of a digital signal processor (DSP).

29 Claims, 2 Drawing Sheets

DIGITAL SIGNAL PROCESSOR BASED AGC

TECHNICAL FIELD

This invention pertains to automatic gain controls in general and more particularly to automatic gain controls that may be implemented by means of digital signal processors.

BACKGROUND OF THE INVENTION

Inputs to any system vary with time, input device, and other factors. Systems for processing voice signals, for example, must cope with signals that vary because of a variety of reasons including different human speakers, distances from the audio microphone, transient fluctuations in the transmission facility, etc. In order to effectively process these inputs, it is known to equip the signal processing system with a variable gain stage driven by an automatic gain control (AGC) that compensates for the changing input levels.

Prior AGCs have experienced problems similar to the following:

Some AGCs increase gain when no signal is present, thereby degrading the output signal in the presence of input noise.

Some AGCs have poor attack and decay times, thereby taking too long to respond to increasing or decreasing signals.

Some AGCs with fast attack times change gain during a message, thereby presenting audible level differences to the operator.

Some AGCs use discrete components which change performance with time, temperature, and component variation, thereby decreasing performance.

Until recently, circuit designers have rarely utilized Digital Signal Processor (DSP) technology to solve these, and other, AGC problems, probably due to the substantial per-unit cost of early DSP units. As DSP units become more widely used, however, their per-unit cost will continue to fall and, ultimately, DSPs will be used in more AGC applications. As a result, there is a need for an improved AGC suitable for implementation by a DSP.

SUMMARY OF THE INVENTION

It is an object of the present invention to provide an improved AGC. It is a further object of the invention that such an improved AGC is particularly adaptable for implementation by a DSP. Accordingly, a digital signal processor based AGC is disclosed. According to the invention, an input signal is provided and at least one value is determined based on the energy of the signal. Thereafter, the desired signal gain is computed responsive to the energy value or values. One advantage of this AGC is that it may easily be implemented in digital format by means of a DSP.

DETAILED DESCRIPTION OF THE INVENTION

Figure 1:
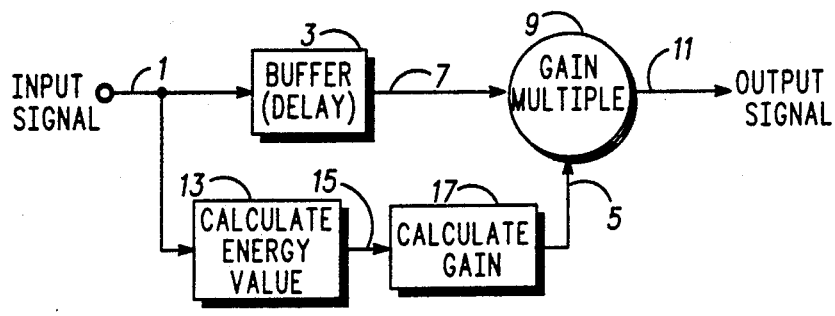
FIG. 1 is a block diagram that shows a first embodiment of a digital signal processor based AGC, according to the invention.

FIG. 1 is a block diagram that shows a first embodiment of a digital signal processor based AGC, according to the invention. Referring now to FIG. 1, the input signal 1 is provided to a buffer 3 that delays the signal while a desired signal gain 5 is calculated. The delayed signal 7 is then presented to an adjustable gain device 9 that amplifies (or multiplies) the signal by the signal gain 5, thereby providing an output signal 11. The input signal 1 is also provided to an energy determining device 13 that determines (or calculates) at least one value 15 based on the energy of the input signal 1. The energy determining device 13 then provides this energy information 15 to a gain determining device 17. The gain determining device 17 determines (or calculates) the signal gain 5 based on the energy information 15. The gain determining device 17 then provides the signal gain 5 to the adjustable gain device 9.

Figure 2:
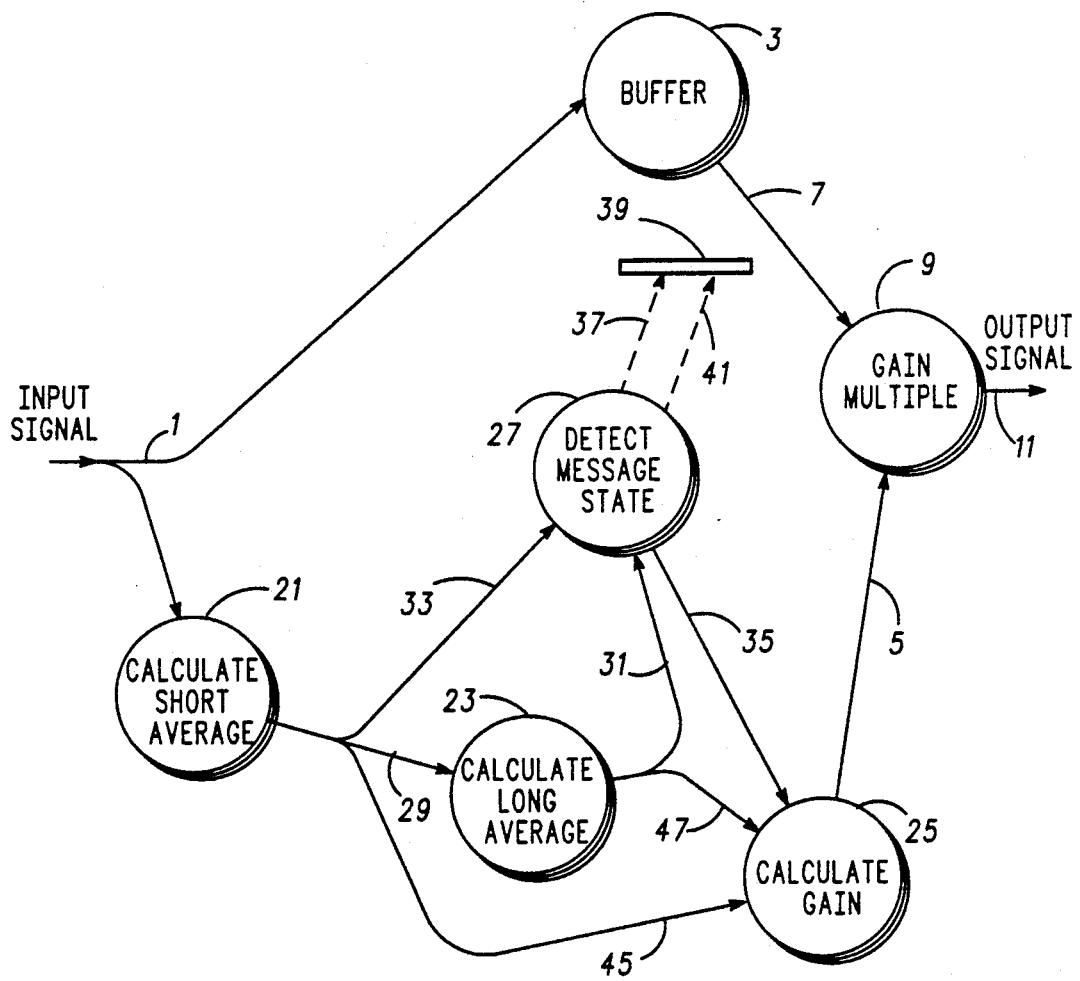
FIG. 2 is an exemplary data flow diagram for the first embodiment.

FIG. 2 is an exemplary data flow diagram for the first embodiment. As will be seen, there are several processes, including buffer the audio input 3, calculate short average energy 21, calculate long average energy 23, calculate gain 25, and determine message state 27.

Referring now to FIG. 2, buffer the audio input 3 uses a circular buffer with a fixed length and fixed delay. As new samples are added, the oldest samples are removed for further processing. Because a finite time is required to determine when a new message has begun, the buffer allows the information about the audio in the buffer to be used to determine the gain of the audio sample being processed. As a result, the attack time on new messages is extremely fast.

There are two processes related to calculating the average energy, namely calculate short average energy 21 and calculate long average energy 23. Calculate short average energy 21 determines the average energy level of the input audio 1 over some predetermined short period of time. This can be done in any convenient method, such as averaging the magnitude of the input audio 1 over some predetermined short period of time, such as 10 ms.

Calculate long average 23 uses the short averages 29 calculated by calculate short average 21 to determine a long average 31. The long average 31 is calculated by taking the running sum of the short averages 29 since the beginning of the message to the current time, and dividing by the number of short averages calculated in that time.

Determine messages state 27 determines the state of the audio input 1. This state can be any one of the following: beginning of a message, message in progress (or steady state), end of message, and no current signal (or noise).

The beginning of a message is indicated when determine message state 27 detects that short average 33 exceeds a predetermined noise threshold, or when there has been a substantial change in the average energy. In both states, determine message state 27 sets message state 35 to beginning of message, indicating that the gain must be re-calculated. Once the long average 31 is stable, determine message state 27 sets message state 35 to message in progress.

To detect a substantial change in the average input level, there must be multiple short averages 33 that are significantly different from the current long average 31 within a predetermined time period. As a result, bursts of noise and pauses between words do not falsely trigger a gain re-calculation.

Once a long average 31 has been established, determine message state 27 compares the current short average 33 to the long average 31. If a majority of short averages are not within a predetermined window around the long average (the "window" being defined by a predetermined high threshold, a predetermined low threshold, and the long average 31), determine message state 27 activates reset long average 37 and sets message state 35 to beginning of message, thus indicating the beginning of a new message. Process controller 39 detects that reset long average 37 is active and resets calculate long average 23.

Determine message state 27 detects the end of a message by comparing the short averge 33 to predetermined threshold. When N (such as 30) short averages out of M (such as 50) are less than the threshold, determine message state 27 activates activity mute 41 and sets message state 35 to end of message. Process controller 39, in turn, detects that activity mute 41 is active and, in response, resets calculate long average 23.

Because determine message state 27 detects the state of the audio input 1 based on the short average 33, it can mute the audio output 11 when no valid signal is present, thereby assuring that the input 1 is not amplified when there is no valid signal present.

Calculate gain 25 determines the new signal gain 5 based on the current message state 35 and the average energy. When message state 35 indicates end of message, no vaild signal present (or noise), gain 5 is set to zero. Otherwise, calculate gain 25 calculates gain 5 based on the quotient of a desired output level and the average energy. The average energy is determined as follows:

when message state 35 indicates beginning of message, the average energy is set to the short average 45;

when message state 35 indicates message in progress (or steady state), the average energy is set to the long average 47.

Figure 3:
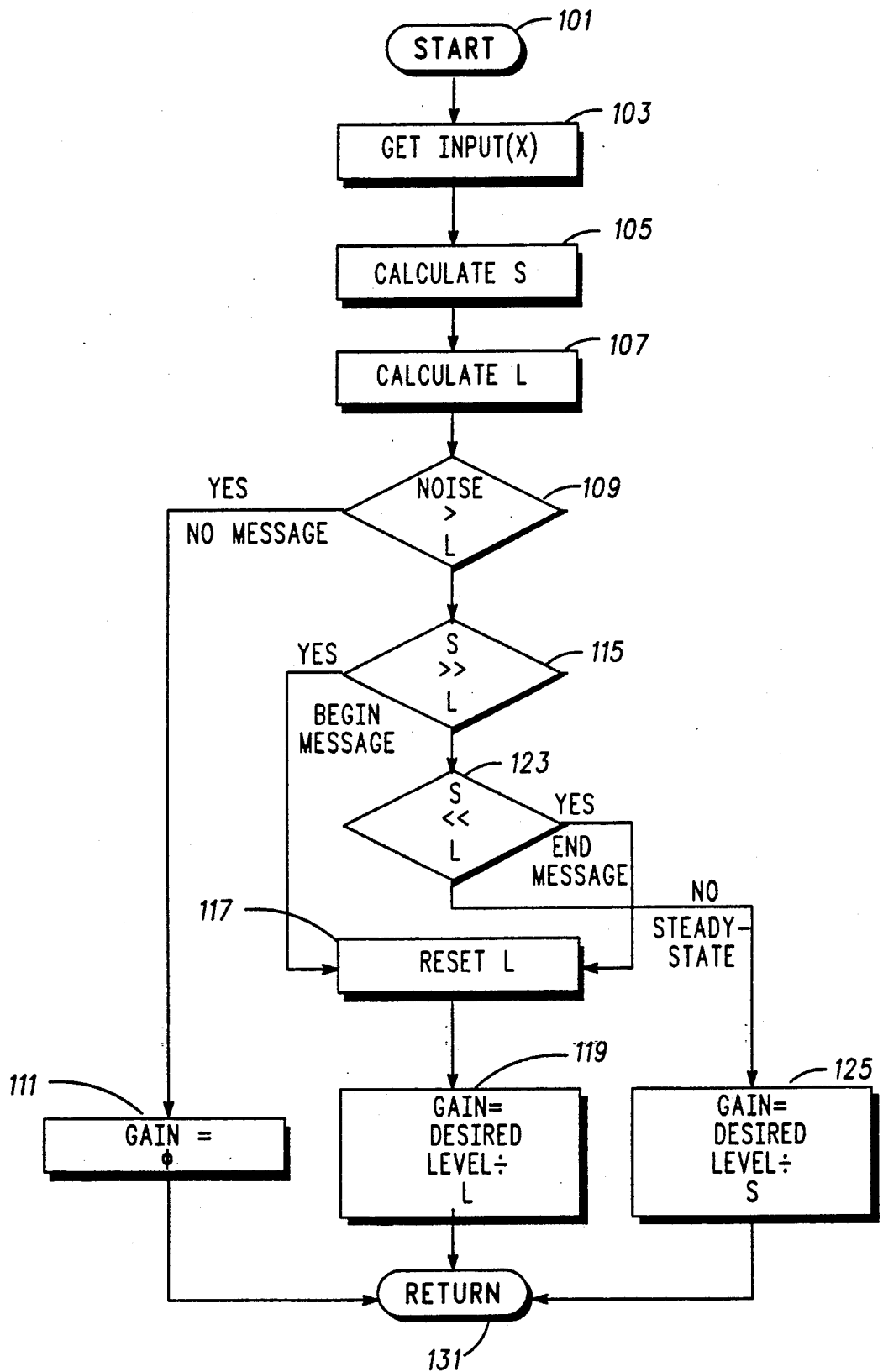
FIG. 3 is an exemplary flow diagram for the first embodiment.

Referring now to FIG. 3, there is shown an exemplary flow diagram for the first embodiment.

Referring still to FIG. 3, the process starts at step 101, and then proceeds to procure an input audio sample ("X"), step 103.

The process next proceeds to step 105, where is calculates a short-term average value ("S"). This can be performed by any convenient method such as, for example, by averaging the absolute value of X over a predetermined short-term time interval such as, for example, 10 ms.

The process next proceeds to step 107, where it calculates a long-term average value ("L"). This can be performed by any convenient method such as, for example, by averaging the absolute value of X over a predetermined long-term time interval such as, for example, 10 ms plus the time elapsed since a predetermined event such as, for example, the event of resetting L (see below).

The process now proceeds to step 109, where it determines whether a predetermined noise threshold exceeds S. If the answer here is affirmative, then there is no valid message present (or noise is present), and the process proceeds to step 111, where the gain is set to zero. The process then returns (step 131) to step 101.

If the answer to determination step 109 is negative, however, then the process next determines whether S is substantially much greater than L, step 115. If the answer here is affirmative, then the message is dramatically increasing or there is a beginning of a message, and the process proceeds to step 117. Here the present value of L is set to equal the present value of S. This is defined as "resetting L". The process next proceeds to step 119, where the gain is set to the quotient of a desired output level and S. The process then returns (step 131) to step 101.

If the answer to determination step 115 is negative, however, then the process next determines whether S is substantially much less than L, step 123. If the answer here is affirmative, then the message is dramatically decreasing or there is an end of message, and the process proceeds to step 117 (described above), where L is reset to equal S. Next the gain is set to the quotient of a desired output level and S, step 119. The process then returns (step 131) to step 101.

If the answer to determination step 123 is negative, however, then there is a message in progress (or the message is steady state), and the process proceeds to step 125. Here the gain is set to the quotient of a desired output level and L. The process next returns (step 131) to step 101.

As has been discussed above, one advantage of this AGC is that it may easily be implemented in digital format by means of a DSP. One DSP that is suitable for this purpose is the Motorola 56000 DSP unit, which may be suitably programmed in accordance with the associated user manual #DSP56000UM/AD. Both of items are available from Motorola, Inc., 1301 East Algonquin Road, Schaumburg, Ill. 60196.

While various embodiments of a digital signal processor based AGC, according to the invention, have been described hereinabove, the scope of the invention is defined by the following claims.

What is claimed is:

1. In a signal processor having a desired output signal level, a buffer, an input signal, a signal gain that may be adjusted, and an output signal, a method for adjusting said signal gain based on said input signal comprising the steps of:
   (a) providing said input signal;
   (b) delaying said input signal by a predetermined time interval in said buffer; (c) determining a desired signal gain value responsive to said input signal;
   (d) adjusting said signal gain responsive to said desired signal gain value;
   (e) providing said output signal responsive to the product of said input signal and said signal gain.

2. The method of claim 1 wherein said determining step (c) includes determining a short-term energy value ("S") responsive to the average magnitude of said input signal over a predetermined short-term time interval.

3. The method of claim 2 wherein said determining step (c) includes determining a long-term energy value ("L") responsive to the average magnitude of said input signal over a predetermined long-term time interval.

4. The method of claim 3 wherein said adjusting step (d) includes adjusting said signal gain substantially to zero when S is less than a predetermined noise threshold.

5. The method claim 4 wherein said adjusting step (d) includes adjusting said signal gain responsive to the ratio of said desired output signal level and S, when S is substantially much greater than L.

6. The method of claim 5 wherein said adjusting step (d) includes adjusting said signal gain responsive to the ratio of said desired output signal level and S, when S is substantially much less than L.

7. The method of claim 6 wherein said adusting step (d) includes adjusting said signal gain responsive to the ratio of said desired output signal level and L, when S exceeds said predetermined noise threshold and is substantially steady state.

8. The method of claim 7 wherein said adjusting step (d) includes resetting the present value of L to substantially equal the present value of S, when S is substantially much greater than L or when S is substanially much less than L.

9. The method of claim 8 wherein said predetermined long-term time interval is responsive to the sum of said predetermined short-term time interval and the time elapsed since resetting L.

10. The method of claim 8 wherein said steps (a) through (e) are substantially performed by a digital signal processor (DSP).

11. A signal processor having a desired output signal level, a buffer, an input signal, a signal gain that may be adjusted, and an output signal, said processor comprising:
  means for providing said input signal;
  means for delaying said input signal by a predetermined time interval is said buffer;
  means for determining a desired signal gain value responsive to said input signal;
  means for adjusting said signal gain responsive to said desired signal gain value;
  means for providing said output signal responsive to the product of said input signal and said signal gain.

12. The signal processor of claim 11 wherein said determining means includes means for determining a short-term energy value ("S") responsive to the average magnitude of said input signal over a predetermined short-term time interval.

13. The signal processor of claim 12 wherein said determining means includes means for determining a long-term energy value ("L") responsive to the average magnitude of said input signal over a predetermined long-term time interval.

14. The signal processor of claim 13 wherein said adjusting means includes means for adjusting said signal gain substantially to zero when S is less than a predetermined noise threshold.

15. The signal processor of claim 14 wherein said adjusting means includes means for adjusting said signal gain responsive to the ratio of said desired output signal level and S, when S is substantially much greater than L.

16. The signal processor of claim 15 wherein said adjusting means includes means for adjusting said signal gain responsive to the ratio of said desired output signal level and S, when S is substantially much less than L.

17. The signal processor of claim 16 wherein said adjusting means includes means for adjusting said signal gain responsive to the ratio of said desired output signal level and L, when S exceeds said predetermined threshold and is substantially steady state.

18. The signal processor of claim 17 wherein said adjusting means includes means for resetting the present value of L to substantially equal the present value of S, when S is substantially much greater than L or when S is substantially much less than L.

19. The signal processor of claim 18 wherein said predetermined long-term time interval is responsive to the sum of said predetermined short-term time interval and the time elapsed since resetting L.

20. The signal processor claim 18 wherein said providing means, said determining means and said adjusting means are substantially embodied by a digital signal processor (DSP).

21. A programmable signal processor (such as a digital signal processor) having a desired output signal level, a buffer, an input signal, a signal gain that may be adjusted, and an output signal, and programmed for adjusting said signal gain based on said input signal according to the method comprising the steps of:
  (a) providing said input signal;
  (b) delaying said input signal by a predetermined time interval in said buffer;
  (c) determining a desired signal gain value responsive to said input signal;
  (d) adjusting said signal gain responsive to said desired signal gain value;
  (e) providing said output signal responsive to the product of said input signal and said signal gain.

22. The programmable signal processor of claim 21 wherein said determining step (c) includes determining a short-term energy value ("S") responsive to the average magnitude of said input signal over a predetermined short-term time interval.

23. The programmable signal processor of claim 22 wherein said determining step (c) includes determining a long-term energy value ("L") responsive to the average magnitude of said input signal over a predetermined long-term time interval.

24. The programmable signal processor of claim 23 wherein said adjusting step (d) includes adjusting said signal gain substantially to zero when S is less than a predetermined noise threshold.

25. The programmable signal processor of claim 24 wherein said adjusting step (d) includes adjusting said signal gain responsive to the ratio of said desired output signal level and S, when S is substantially much greater than L.

26. The programmable signal processor of claim 25 wherein said adjusting step (d) includes adjusting said signal gain responsive to the ratio of said desired output signal level and S, when S is substantially much less than L.

27. The programmable signal processor of claim 26 wherein said adjusting step (d) includes adjusting said signal gain responsive to the ratio of said desired output signal level and L, when S exceeds said predetermined noise threshold and is substantially steady state or stable.

28. The programmable signal processor claim 27 wherein said adjusting step (d) includes resetting the present value of L to substantially equal the present value of S, when S is substantially much greater than L or when S is substantially much less than L.

29. The programmable signal processor of claim 28 wherein said predetermined long-term time interval is responsive to the sum of said predetermined short-term time interval and the time elapsed since last resetting L.

* * * * *

UNITED STATES PATENT AND TRADEMARK OFFICE
CERTIFICATE OF CORRECTION

PATENT NO. : 5,016,205
DATED : May 14, 1991
INVENTOR(S) : Peggy P. Shumway

It is certified that error appears in the above-identified patent and that said Letters Patent is hereby corrected as shown below:

Column 5, line 27, "is" should be --in--.

Column 6, line 7, "processor claim" should be --processor of claim--.

Column 6, line 56, "processor claim" should be --processor of claim--.

Signed and Sealed this

Ninth Day of March, 1993

Attest:

STEPHEN G. KUNIN

Attesting Officer

Acting Commissioner of Patents and Trademarks